United States Patent
Bash et al.

(10) Patent No.: US 7,640,760 B2
(45) Date of Patent: Jan. 5, 2010

(54) TEMPERATURE CONTROL USING A SENSOR NETWORK

(75) Inventors: Cullen E. Bash, San Francisco, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 821 days.

(21) Appl. No.: 11/089,608

(22) Filed: Mar. 25, 2005

(65) Prior Publication Data

US 2006/0214014 A1  Sep. 28, 2006

(51) Int. Cl.
*F25D 17/00* (2006.01)
*G05D 23/00* (2006.01)
*G06F 1/00* (2006.01)

(52) U.S. Cl. .................. 62/178; 700/299; 700/300; 713/300

(58) Field of Classification Search .................. 62/178, 62/259.2, 263; 165/104.3; 236/49.3
See application file for complete search history.

(56) References Cited

U.S. PATENT DOCUMENTS

| | | | |
|---|---|---|---|
| 6,283,380 B1* | 9/2001 | Nakanishi et al. | 236/49.3 |
| 6,374,627 B1* | 4/2002 | Schumacher et al. | 62/259.2 |
| 6,574,104 B2* | 6/2003 | Patel et al. | 361/695 |
| 6,854,659 B2* | 2/2005 | Stahl et al. | 236/49.3 |
| 6,868,682 B2* | 3/2005 | Sharma et al. | 62/180 |
| 6,957,544 B2* | 10/2005 | Dobbs et al. | 62/178 |
| 7,251,547 B2* | 7/2007 | Bash et al. | 700/276 |
| 7,275,380 B2* | 10/2007 | Durant et al. | 62/178 |
| 2003/0193777 A1* | 10/2003 | Friedrich et al. | 361/687 |
| 2003/0221821 A1* | 12/2003 | Patel et al. | 165/247 |
| 2004/0141542 A1* | 7/2004 | Sharma et al. | 374/141 |
| 2005/0182523 A1* | 8/2005 | Nair | 700/276 |
| 2005/0241325 A1* | 11/2005 | Olney | 62/178 |
| 2005/0257537 A1* | 11/2005 | Chang et al. | 62/176.6 |
| 2005/0257539 A1* | 11/2005 | Lee et al. | 62/180 |
| 2006/0080001 A1* | 4/2006 | Bash et al. | 700/276 |
| 2007/0100494 A1* | 5/2007 | Patel et al. | 700/190 |

FOREIGN PATENT DOCUMENTS

JP  2000241002 A  *  9/2000

OTHER PUBLICATIONS

Patel et al. "Smart chip, system and data center enabled by advanced flexible cooling resources", 2005 IEEE Twenty First Semi-Annual Symposium, Mar. 15-17, 2005.*

* cited by examiner

*Primary Examiner*—Chen-Wen Jiang

(57) ABSTRACT

In a method for controlling temperature using a sensor network, the sensors of the sensor network are commissioned and one of a plurality of control schemes for operating a primary actuator configured to vary temperatures of the sensors based upon energy utilization requirements of the plurality of control schemes is selected. In addition, the selected one of the plurality of control schemes is implemented to vary the temperatures detected by the sensors.

21 Claims, 9 Drawing Sheets

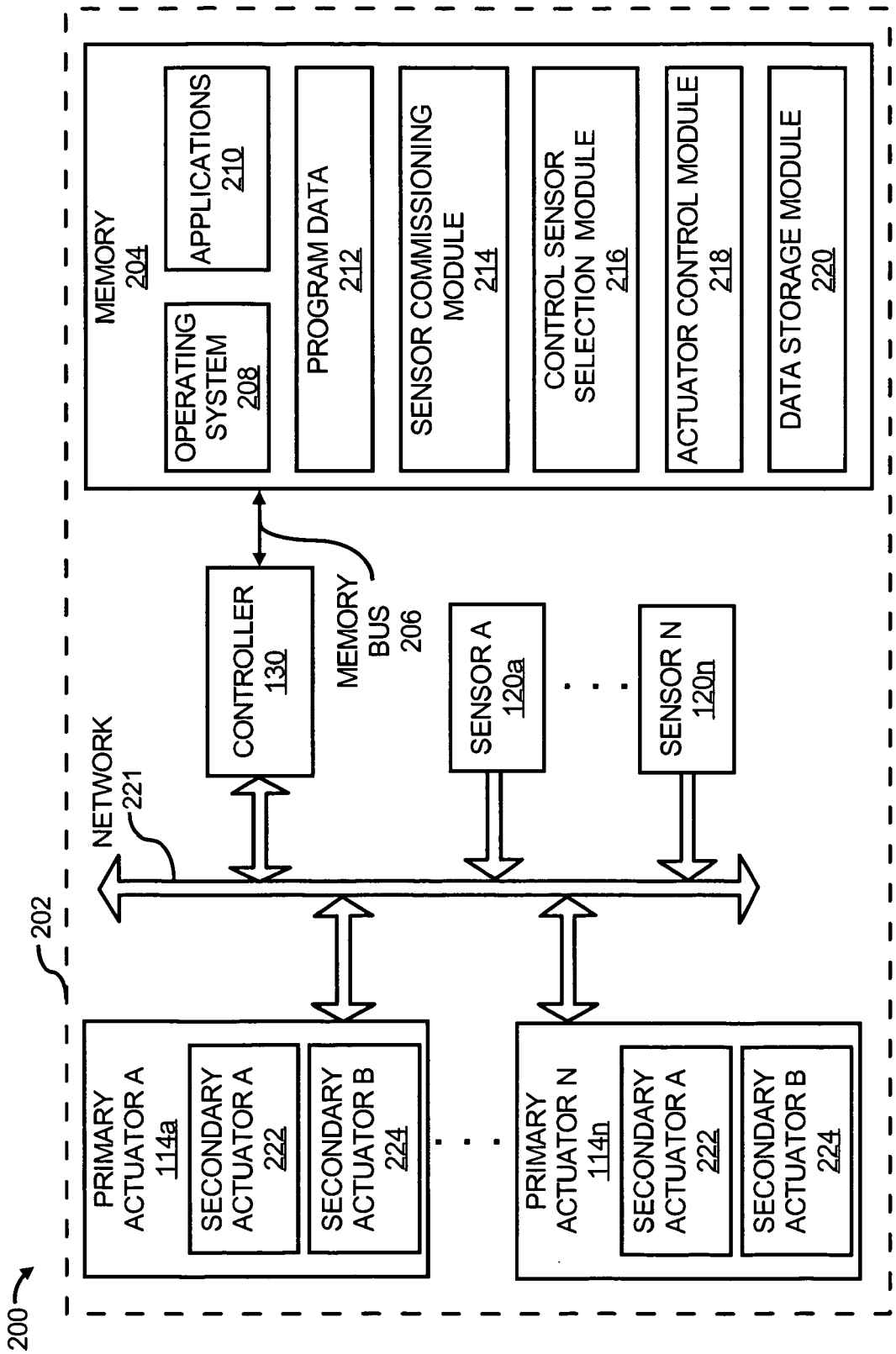

US 7,640,760 B2

TEMPERATURE CONTROL USING A SENSOR NETWORK

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system containing multiple microprocessors dissipates approximately 250 W of power. Thus, a rack containing forty (40) computer systems of this type dissipates approximately 10 KW of power.

Current approaches to provisioning cooling to dissipate the heat generated by the cooling systems are typically based upon temperatures detected at the inlets of air conditioning units. Oftentimes, however, the temperatures detected at the air conditioning unit inlets are not an accurate reflection of the temperatures of the computer systems being cooled. In many instances, therefore, the provisioning of the cooling is based on the nameplate power ratings of all of the computer systems in the data center, with some slack for risk tolerance. This type of cooling provisioning oftentimes leads to excessive and inefficient cooling solutions. This problem is further exacerbated by the fact that in most data centers, the cooling is provisioned for worst-case or peak load scenarios. Since it is estimated that typical data center operations only utilize a fraction of the servers, provisioning for these types of scenarios often increases the inefficiencies found in conventional cooling arrangements.

As such, it would be beneficial to have thermal management that more effectively and efficiently utilizes the air conditioning units in data centers.

SUMMARY

A method for controlling temperature using a sensor network is disclosed herein. In the method, the sensors of the sensor network are commissioned and one of a plurality of control schemes for operating a primary actuator configured to vary temperatures of the sensors based upon energy utilization requirements of the plurality of control schemes is selected. In addition, the selected one of the plurality of control schemes is implemented to vary the temperatures detected by the sensors.

BRIEF DESCRIPTION OF THE DRAWINGS

Features of the present invention will become apparent to those skilled in the art from the following description with reference to the figures, in which:

FIG. 2 is a block diagram of an environmental control system according to an embodiment of the invention;

DETAILED DESCRIPTION

Figure 1A:
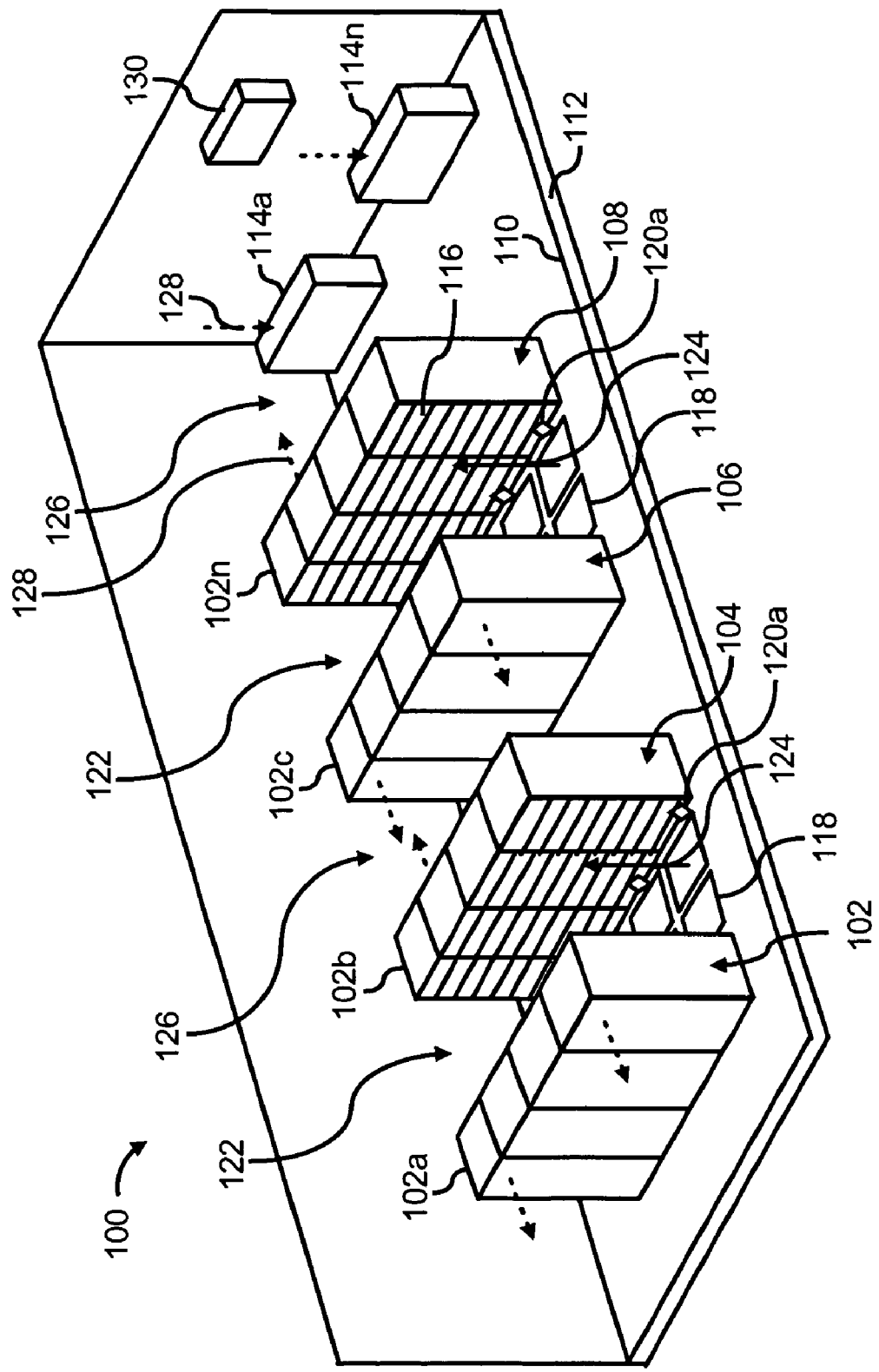
FIG. 1A shows a simplified perspective view of a data center, according to an embodiment of the invention.

For simplicity and illustrative purposes, the present invention is described by referring mainly to an embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Systems and methods for thermal management by utilizing a distributed sensor network in controlling actuators are disclosed herein. More particularly, the disclosed thermal management systems and methods pertain to the control of actuators based upon correlations developed between the actuators and the sensors of the sensor network. The correlations may be developed through a process for commissioning the sensors with respect to the actuators. In addition, the correlations generally provide indications of how the sensors of the sensor network may be affected by variations in the outputs of the actuators.

An example of a commissioning process suitable for correlating the actuators and the sensors is disclosed in co-pending and commonly assigned U.S. patent application Ser. No. 11/078,087, filed on Mar. 11, 2005, now U.S. Pat. No. 7,117, 129, and entitled "Commissioning of Sensors", the disclosure of which is hereby incorporated by reference in its entirety. As disclosed in that application, sensors may be grouped into actuator (CRAC unit) families according to the levels of influence each actuator has on each sensor as determined during a commissioning process.

As further disclosed herein, the actuators may be manipulated according to various control schemes designed to reduce the energy utilization required to substantially maintain the sensors within predetermined temperature ranges. In addition, the control scheme requiring the least amount of energy utilization for a particular actuator may be determined and implemented in operating the actuators.

In one example, the actuators comprise computer room air conditioning (CRAC) units capable of varying one or both of volume flow rate and temperature of airflow supplied to sensors in a data center. In this example, the determination of which CRAC units to manipulate, for instance, to maintain a particular sensor below a predetermined maximum temperature, is based upon the correlations determined between the CRAC units and the sensors. In addition, the CRAC units may be manipulated according to a selected control scheme as described above.

The systems and methods for thermal management disclosed herein may also be employed in any reasonably suitable environment containing actuators and sensors, such as, a building containing air conditioning units and sensors. In this regard, although particular reference is made throughout the present disclosure to data centers and CRAC units, it should be understood that the systems and methods disclosed herein may be implemented in other environments. In addition, therefore, the particular references to data centers and CRAC units are for illustrative purposes and are not intended to limit the systems and methods disclosed herein solely to data centers and CRAC units.

With reference first to FIG. 1A, there is shown a simplified perspective view of a section of a data center 100 which may employ various examples of the environmental control system disclosed herein. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer greater than one. The racks 102a-102n may comprise electronics cabinets, aligned in parallel rows and positioned on a raised floor 110. A plurality of wires and communication lines (not shown) may be located in a space 112 beneath the raised floor 110. The space 112 may also function as a plenum for delivery of cooled air from one or more actuators.

Also shown in FIG. 1A are computer room air conditioning (CRAC) units 114a-114n, where "n" is an integer greater than one, which are considered herein as primary actuators 114a-114n. The CRAC units 114a-114n are considered primary actuators 114a-114n because they are configured to manipulate a characteristic of the cooled airflow supplied to the racks 102a-102n through actuation of one or more secondary actuators. The secondary actuators include a device for controlling airflow temperature and a device for controlling the supply flow rates of the cooled air.

The cooled air may be delivered from the space 112 to the racks 102a-102n through vent tiles 118 located between some or all of the racks 102a-102n. The vent tiles 118 are shown as being located between rows 102 and 104 and 106 and 108. The cooled air contained in the space 112 may include cooled air supplied by one or more primary actuators 114a-114n. Thus, characteristics of the cooled air, such as, temperature, pressure, humidity, flow rate, etc., may substantially be affected by the operations of one or more of the primary actuators 114a-114n. In this regard, characteristics of the cooled air at various areas in the space 112 and the cooled air supplied to the racks 102a-102n may vary, for instance, due to mixing of the cooled air. In other words, the characteristics of the cooled air supplied to a particular location in the data center 100 may differ from that of the cooled air supplied by a single primary actuator 114a.

At least one condition, for instance, temperature, pressure, or humidity, of the cooled air supplied to various areas of the data center 100 may be detected by sensors 120a-120n, where "n" is an integer greater than one. As shown, the sensors 120a-120n are represented as diamonds to distinguish them from other elements depicted in FIG. 1A. In addition, the sensors 120a-120n are depicted as being positioned to detect the at least one condition at the inlets of the racks 102a-102n. In this example, the sensors 120a-120n may comprise temperature sensors or absolute humidity sensors. In another example, the sensors 120a-120n may be positioned within the space 112 near respective vent tiles 118 to detect the temperature, pressure, or humidity of the cooled air supplied through the respective vent tiles 118. Thus, although the sensors 120a-120n are depicted as being located on the raised floor 110, the sensors 120a-102n may be positioned at various other reasonably suitable locations, including, for example, near or within some or all of the components 116.

In any regard, the sensors 120a-120n may be employed to detect the at least one condition at various primary actuator 114a-114n settings. In addition, the sensors 120a-120n may be assigned to the families of one or more primary actuators 114a-114n. A primary actuator 114a-114n "family" may be defined as a grouping of sensors 120a-120n that respond to the various primary actuator 114a-114n settings to levels greater than a predefined threshold level. In other words, the sensor 120u may be considered as being in the primary actuator 114a family if the response of the sensor 120a exceeds a predefined threshold level at various primary actuator 114a-114n settings. Various manners in which the sensors 120a-120n may be assigned to the one or more primary actuator 114a-114n families is described in the co-pending and commonly assigned U.S. Pat. No. 7,117,129.

The racks 102a-102n are generally configured to house a plurality of components 116 capable of generating/dissipating heat, for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like.

The areas between the rows 102 and 104 and between the rows 106 and 108 may comprise cool aisles 122. These aisles are considered "cool aisles" because they are configured to receive cooled airflow from the vent tiles 118, as generally indicated by the arrows 124. In addition, and as shown, the racks 102a-102n generally receive cooled air from the cool aisles 122. The aisles between the rows 104 and 106, and on the rear sides of rows 102 and 108, are considered hot aisles 126. These aisles are considered "hot aisles" because they are positioned to receive air that has been heated by the components 116 in the racks 102a-102n, as indicated by the arrows 128.

Although not shown, the racks 102a-102n may be positioned with their rear sides adjacent to one another. In this example, the vent tiles 118 may be provided in each aisle 122 and 126. In addition, the racks 102a-102n may comprise outlets on top panels thereof to enable heated air to flow out of the racks 102a-102n.

As described herein above, the primary actuators 114a-114n generally operate to cool received heated air as indicated by the arrows 128. In addition, the primary actuators 114a-114n may supply the racks 102a-102n with airflow that has been cooled, through any reasonably suitable known manners and may thus comprise widely available, conventional CRAC units. For instance, the primary actuators 114a-114n may comprise vapor-compression type air conditioning units, chilled water air conditioning units, etc. Examples of suitable primary actuators 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a controller 130 configured to perform various functions in the data center 100. The controller 130 may receive data from the primary actuators 114a-114n and the sensors 120a-120n and may perform various computations on the data. In one regard, the controller 130 may operate to assign the sensors 120a-120n into one or more primary actuator 114a-114n families. According to an example, the controller 130 may implement the commissioning procedures disclosed in the co-pending and commonly assigned U.S. patent application Ser. No. 11/078,087 to assign the sensors 120a-120n into the one or more primary actuator 114a-114n families.

The controller 130 may also operate the primary actuators 114a-114n based upon the correlations between the primary actuators 114a-114n and the sensors 120a-120n. In operating the primary actuators 114a-114n, the controller 130 may select and implement one or more control schemes as described in greater detail herein below.

Although the controller 130 is illustrated in FIG. 1A as comprising a component separate from the components 116 housed in the racks 102-108, the controller 130 may comprise one or more of the components 116 without departing from a scope of the data center 100 disclosed herein. In addition, or alternatively, the controller 130 may comprise software configured to operate on a computing device, for instance, one of the components 116.

Figure 1B:
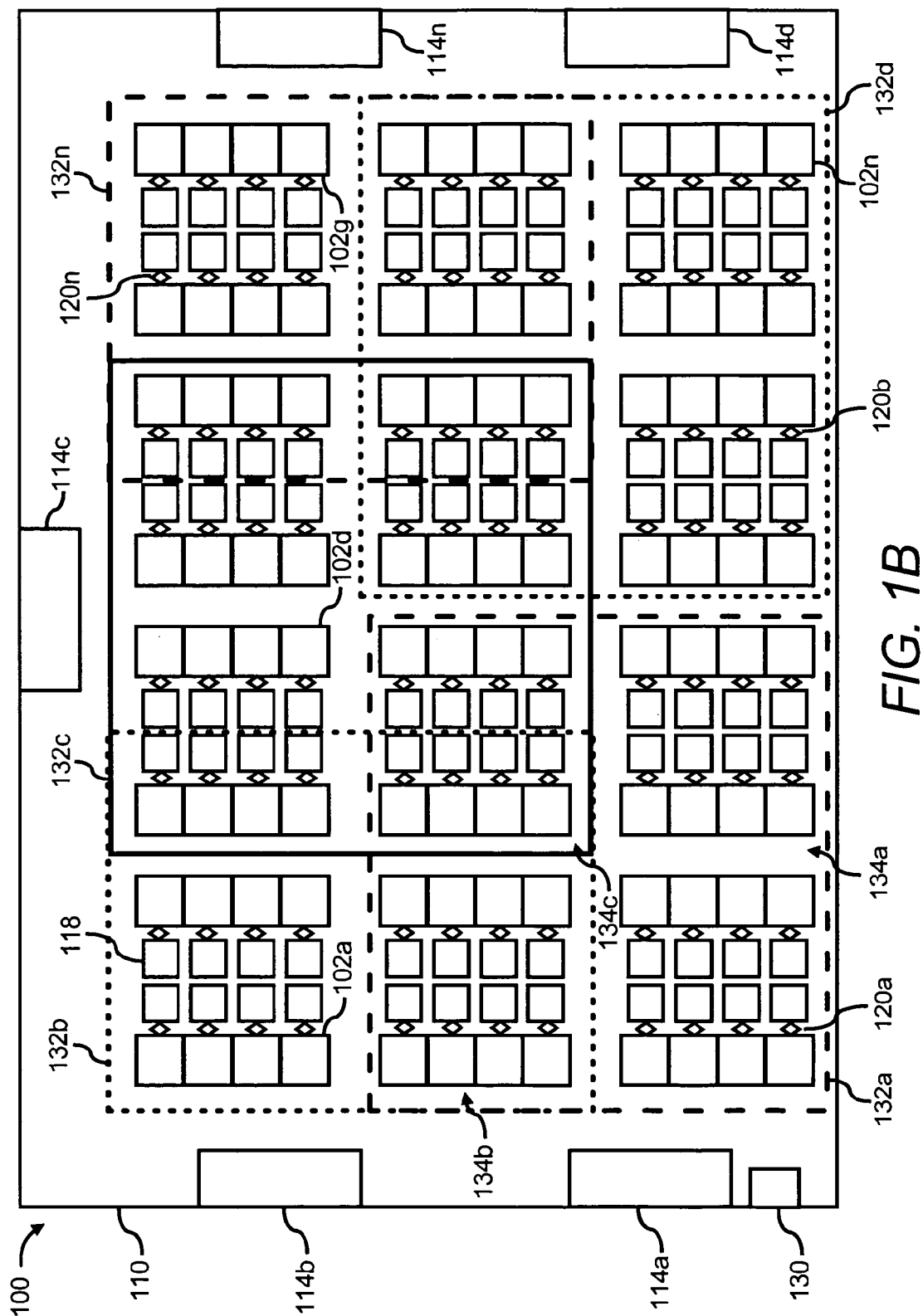
FIG. 1B is a simplified plan view of the data center depicted in FIG. 1A.

With reference now to FIG. 1B, there is shown a simplified plan view of the data center 100 depicted in FIG. 1A. The data center 100 is shown as including primary actuators 114a-114n positioned at various locations throughout the data center 100. A plurality of vent tiles 118 are also illustrated in FIG. 1B and are configured to deliver cooled airflow to racks 102a-102n as described above. It should be appreciated that the data center 100 may include any reasonably suitable number of racks 102a-102n and primary actuators 114a-114n without departing from the data center 100 illustrated in FIG. 1B.

As described herein above, the vent tiles 118 and the racks 102a-102n are positioned on a raised floor 110, beneath which lies a space 112 (FIG. 1A). The space 112 is in fluid communication with the primary actuators 114a-114n and generally operates, in one respect, as a plenum for supplying cooling airflow from the primary actuators 114a-114n to be delivered through the vent tiles 118. In most instances, the space 112 may comprise a relatively open space that is accessible by cooling airflow supplied by a plurality of the primary actuators 114a-114n. In this regard, the cooling airflow supplied by the primary actuators 114a-114n may mix in the space 112. Therefore, the cooling airflow supplied to the racks 102a-102n by the vent tiles 118 may have originated from more than one of the primary actuators 114a-114n.

Although particular reference is made throughout the present disclosure to a raised floor 110, it should be understood that various other types of cooling arrangements may be employed without departing from the systems and methods disclosed herein. For instance, the data center 100 may include a lowered ceiling which may also include a space that is operable as a plenum. In addition, or alternatively, the data center 100 may include ceiling mounted heat exchangers, such as those disclosed in commonly assigned U.S. Pat. No. 6,786,056, entitled "Cooling System With Evaporators Distributed In Parallel", the disclosure of which is hereby incorporated by reference in its entirety.

Also shown in FIG. 1B are the sensors 120a-120n, which are illustrated as being positioned with respect to each of the racks 102a-102n. As also stated above, the sensors 120a-120n may also, or in the alternative, be positioned to detect the at least one condition within the space 112. In addition, the sensors 120a-120n may comprise sensors contained in some or all of the components 116. As a further example, the sensors 120a-120n may be positioned near or within the primary actuators 114a-114n. In any regard, the sensors 120a-120n may be grouped in various primary actuator 114a-114n families based upon various criteria. The various primary actuator 114a-114n families 132a-132n corresponding to respective primary actuators 114a-114n are illustrated in FIG. 1B. As shown, the sensors 120a-120n are considered as being within the families 132a-132n of those primary actuators 114a-114n.

Some of the sensors 120a-120n, for instance, the sensors 120a-120n in a first section 134a may be included in the family 132a of a single primary actuator 114a. Some of the other sensors 120a-120n, for instance, the sensors 120a-120n in a second section 134b may be included in the families 132a and 132b of two primary actuators 114a and 114b. In addition, some of the sensors 120a-120n, for instance, the sensors 120a-120n in a third section 134c may be included in the families 132a-132c of three primary actuators 114a-114c. As such, for instance, one or more of the sensors 120a-120n may belong to more than one primary actuator 114a-114n family.

It should, in any regard, be understood that the families 132a-132n depicted in FIG. 1B are for purposes of illustration and are not intended to limit the data center 100 and its components in any respect. It should also be understood that the depiction of the families 132a-132n in FIG. 1B are for illustrative purposes only and are not meant to limit the data center 100 in any respect.

FIG. 2 is a block diagram 200 of an environmental control system 202. It should be understood that the following description of the block diagram 200 is but one manner of a variety of different manners in which such an environmental control system 202 may be configured. In addition, it should be understood that the environmental control system 202 may include additional components and that some of the components described herein may be removed and/or modified without departing from the scope of the environmental control system 202. For instance, the environmental control system 202 may include any number of sensors, memories, processors, CRAC units, etc., as well as other components, which may be implemented in the operations of the environmental control system 202.

Generally speaking, the environmental control system 202 is employed to control the primary actuators 114a-114n, to thereby control at least one environmental condition at the sensor 120a-120n locations. As described in greater detail herein below, determination of primary actuator 114a-114n families may be used to determine which of the primary actuators 114a-114n are to be manipulated in response to conditions detected by the sensors 120a-120n. The control over the primary actuators 114a-114n may be effectuated through manipulation of one or more secondary actuators 222 and 224. One of the secondary actuators 222 may comprise a variable frequency drive (VFD) for controlling an airflow volume varying device, such as a blower or fan. The other secondary actuator 224 may comprise a device for controlling the temperature of the cooled air supplied by the primary actuators 114a-114n. Thus, the secondary actuator 224 may depend upon the type of primary actuator 114a-114n in which the secondary actuator 224 is located.

More particularly, for instance, if the primary actuator 114a-114n comprises a vapor-compression type CRAC unit, the secondary actuator 224 may comprise a variable speed compressor configured to vary the temperature of the airflow supplied by the CRAC unit. If the primary actuator 114a-114n comprises a chilled water CRAC unit, the secondary actuator may comprise a two or three-way valve configured to control the temperature of a coolant configured to receive heat from the airflow.

The secondary actuators 224 may also comprise devices for varying other characteristics of the airflow supplied by the primary actuators 114a-114n. The secondary actuators 224 may comprise, for instance, humidifiers/dehumidifiers configured to vary the absolute humidity of the airflow supplied by the primary actuators 114a-114n. In this example, the sensors 120a-120n may comprise absolute humidity sensors. In addition, therefore, the primary actuators 114a-114n in this example may operate to maintain the absolute humidity levels at the sensor 120a-120n locations within predefined thresholds.

In any respect, the controller 130 is configured to control the primary actuators 114a-114n and thus the secondary actuators 222 and 224. The controller 130 may comprise a computing device, for instance, a computer system, a server, a proportional, integral, derivative (PID) control system, etc. In addition, the controller 130 may comprise a microprocessor, a micro-controller, an application specific integrated circuit (ASIC), and the like, configured to perform various processing functions. In addition, or alternatively, the controller 130 may comprise software operating in any of a number of computing devices.

The controller 130 is illustrated as being in communication with a memory 204 through, for instance, a memory bus 206. However, in certain instances, the memory 204 may form part of the controller 130 without departing from a scope of the environmental control system 202. Generally speaking, the memory 204 may be configured to provide storage of software, algorithms, and the like, that provide the functionality of the controller 130. By way of example, the memory 204 may store an operating system 208, application programs 210, program data 212, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 also stores a sensor commissioning module 214, a control sensor selection module 216, an actuator control module 218, and data storage module 220. The controller 130 may implement the modules 214-220 in controlling the environmental conditions at the sensor 120a-120n locations.

The controller 130 may implement the sensor commissioning module 214 to commission the sensors 120a-120n. More particularly, the controller 130 may implement the sensor commissioning module 214 to assign each of the sensors 120a-120n to one or more primary actuator 114a-114n families. The commissioning of the sensors 120a-120n may be performed as disclosed in the co-pending and commonly assigned U.S. Pat. No. 7,117,129.

The controller 130 may implement the control sensor selection module 216 to select a control sensor 120n for each of the primary actuator 114a-114n families. The control sensor 120n may be defined as the sensor 120a-120n with the largest positive temperature difference from a setpoint in each primary actuator 114a-114n family. If all of the sensors 120a-120n have negative temperature differences from the at least one setpoint temperature, then the control sensor 120n is the sensor 120a-120n with the largest negative difference from the setpoint temperature. The setpoint temperature used to determine the control sensor 120n may vary between the sensors 120a-120n and is thus not required to be identical for all of the sensors 120a-120n.

The controller 130 may implement the actuator control module 218 to select a control scheme and to implement the selected control scheme in controlling or otherwise transmitting control signals to the primary actuators 114a-114n as described in greater detail herein below.

The controller 130 may implement the data storage module 220 to store various data in a data storage location in the memory 204. The data storage module 220 may be implemented to store the correlations between the sensors 120a-120n and the primary actuators 114a-114n. The data storage module 220 may store this correlation information in a variety of different manners. For instance, the data storage module 220 may store the information in the form of a look-up table. In addition, or alternatively, the data storage module 220 may store the information in the form of a map that may be employed to visualize the positions of the sensors 120a-120n and the families 132a-132n to which they are related.

Instructions from the controller 130 may be transmitted over a network 221 that operates to couple the various components of the environmental control system 202. Although not shown, the controller 130 may be equipped with or have access to software and/or hardware to enable the controller 130 to transmit and receive data over the network 221. The network 221 generally represents a wired or wireless structure in the data center 100 for the transmission of data between the various components of the environmental control system 202. The network 221 may comprise an existing network infrastructure or it may comprise a separate network configuration installed for the purpose of environmental control by the controller 130.

The sensors 120a-120n may be configured to transmit collected data over the network 221 for storage and processing. As stated above, the sensors 120a-120n may comprise sensors configured to detect at least one environmental condition at various locations in the data center 100. The at least one environmental condition may comprise temperature, absolute humidity, or pressure and the sensors 120a-120n may be configured to detect at least one of these conditions. The sensors 120a-120n may also be configured to compare detected environmental conditions with predefined environmental conditions to determine differences between the detected environmental conditions and the predefined environmental conditions. The sensors 120a-120n may transmit these differences as signals to the controller 130, where the strengths of the signals correspond to the difference levels. In addition, the controller 130 may vary operations of the actuator control module 218 according to the types of environmental condition detected and the magnitudes of the signals received from the sensors 120a-120n.

The primary actuators 114a-114n may also include respective interfaces (not shown) that generally enable data transfer between the primary actuators 114a-114n and the controller 130 over the network 221. The interfaces may comprise any reasonably suitable hardware and/or software capable to enabling the data transfer over the network 221. In addition, the primary actuators 114a-114n may also include controllers (not shown) configured to control the secondary actuators 222 and 224 based upon instructions or signals received from the controller 130. In one example, the controller 130 and the controllers of the primary actuators 114a-114n may both comprise proportional, integral, derivative (PID) controllers, for instance, in a cascading PID control arrangement. In this example, the controller 130 may receive signals from the sensors 120a-120n having magnitudes corresponding to the differences between detected and predefined conditions. The controller 130 may transmit signals to the controllers of the primary actuators 114a-114n according to the magnitudes of the signals received from the sensors 120a-120n. In addition, the controllers of the primary actuators 114a-114n may operate the secondary actuators 222 and 224 according to the magnitudes of the signals received from the controller 130.

Figure 3:
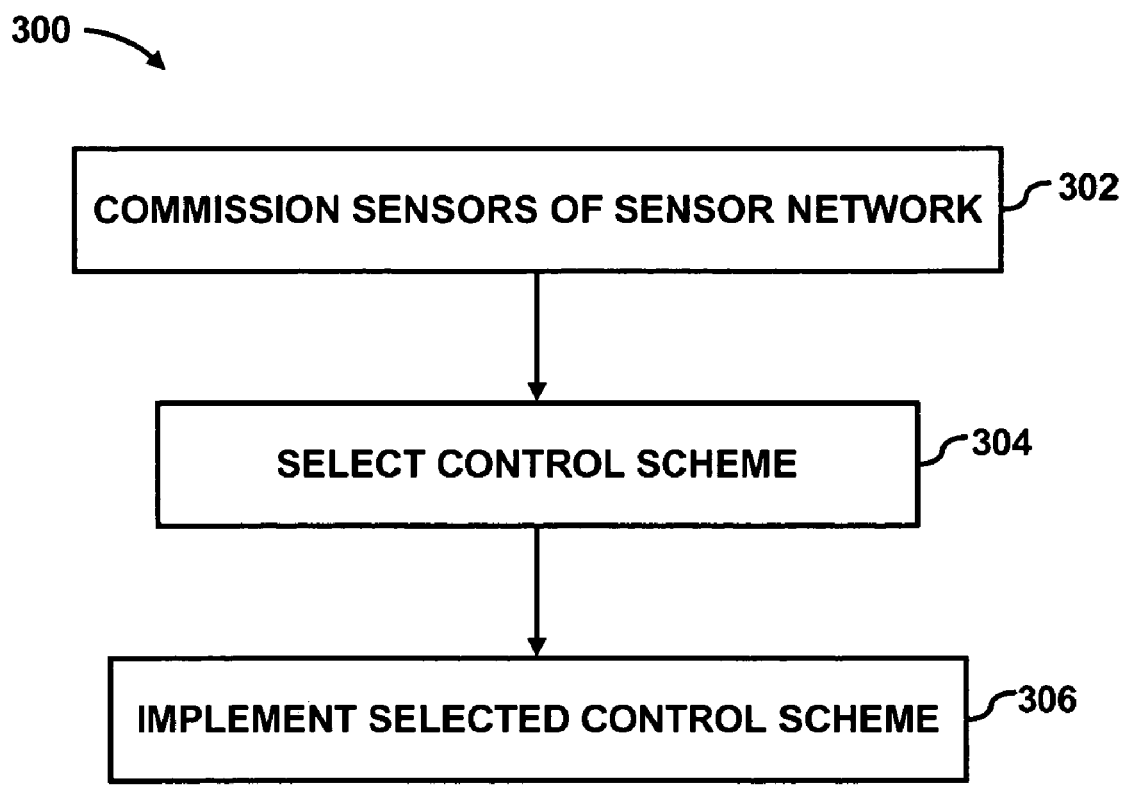
FIG. 3 illustrates a flow diagram of a method for controlling temperature using a sensor network, according to an embodiment of the invention.

FIG. 3 illustrates a flow diagram of a method 300 for controlling temperature using a sensor network, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the block diagram 200 illustrated in FIG. 2, and thus makes reference to the elements cited therein. It should, however, be understood that the method 300 is not limited to the elements set forth in the block diagram 300. Instead, it should be understood that the method 300 may be practiced by an enviromnental control system having a different configuration than that set forth in the block diagram 200.

The method 300 may be implemented to control the temperature of the airflow supplied to the sensors 120a-120n by the primary actuators 114a-114n. In the method 300, the controller 130 may commission the sensors 120a-120n of a network of sensors at step 302. The controller 130 may also select one of a plurality of control schemes for operating a primary actuator 114a-114n configured to vary temperatures of the sensors 120a-120n at step 304. The selection of the control scheme may be based upon energy utilization requirements of the plurality of control schemes. In addition, the controller 130 may implement the selected one of the plurality of control schemes to vary the temperatures detected by the sensors 120a-120n at step 306. A more detailed description of the steps outlined in the method 300 is provided below with respect to the method 400.

Figure 4:
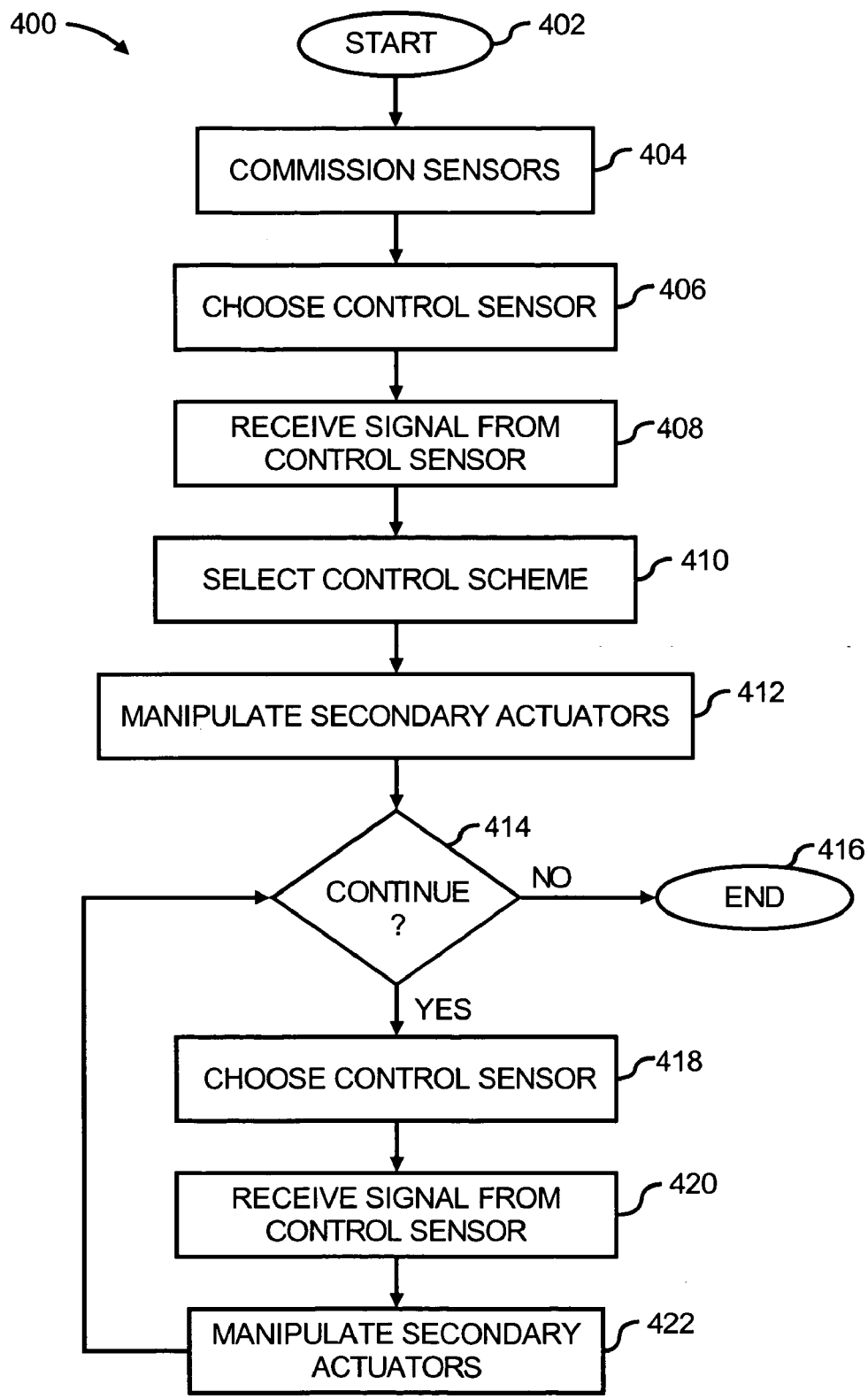
FIG. 4 illustrates a flow diagram of a method for controlling environmental conditions at sensor locations, according to an embodiment of the invention.

With particular reference now to FIG. 4, there is shown a flow diagram of a method 400 for controlling environmental conditions at the sensor 120a-120n locations, according to an example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

The method 400 may be implemented to control primary actuators (CRAC units) 114a-114n to thereby control environmental conditions at the sensor 120a-120n locations. For instance, the primary actuators 114a-114n may be controlled as disclosed below to control at least one of temperature, humidity, and pressure at the sensor 120a-120n locations. In addition, the description of the method 400 is made with reference to the block diagram 200 illustrated in FIG. 2, and thus makes reference to the elements cited therein. It should, however, be understood that the method 400 is not limited to the elements set forth in the block diagram 200. Instead, it should be understood that the method 400 may be practiced by an environmental control system having a different configuration than that set forth in the block diagram 200.

The method 400 may be initiated at step 402 in response to any of a number of stimuli or conditions. For instance, the method 400 may be initiated with activation of components, such as, the CRAC units 114a-114n. In addition, or alternatively, the method 400 may be manually initiated or the controller 130 may be programmed to initiate the method 400 at various times, for a set duration of time, substantially continuously, etc.

Once initiated, the controller 130 may implement the sensor commissioning module 214 to commission the sensors 120a-120n at step 404. More particularly, the sensors 120n-120n may be assigned to primary actuator 114a-114a families according to, for instance, the level of influence the primary actuators 114a-114n have over the sensors 120a-120n. In addition, a sensor 120a may be considered as being in the finally of a primary actuator 114a if the level of influence of that actuator 114a over the sensor 120a exceeds a predefined threshold. In addition, if a sensor 120a is assigned to multiple primary actuator 114a-114n families, a filtering process may be implemented to assign the sensor 120a to the primary actuator 114a that has the greatest level of influence over the sensor 120a. The filtering process may also be implemented to keep the sensor in multiple primary actuator 114a-114n families if the influence levels of the primary actuators 114a-114n are within predefined thresholds. Examples of a suitable commissioning process and a suitable filtering process is disclosed in the co-pending and commonly assigned U.S. Pat. No. 7,117,129, the disclosure of which is hereby incorporated by reference in its entirety.

At step 406, for each primary actuator 114a-114n family, the controller 130 may implement the control sensor selection module 216 to choose the control sensor 120n. As described above, the control sensor 120n may be defined as the sensor 120a-120n with the largest positive temperature difference from a setpoint temperature in each primary actuator 114a-114n family. If all of the sensors 120a-120n have negative temperature differences from the at least one setpoint, then the control sensor 120n may be defined as the sensor 120a-120n with the largest negative difference from the setpoint temperature. The setpoint used to determine the control sensor 120n may also vary between the sensors 120a-120n and is thus not required to be identical for all of the sensors 120a-120n.

In general, the temperatures of the control sensors 120a-120n are used to control the primary actuators 114a-114n of the families to which the control sensors 1201a-1120n belong. More particularly, the following steps may be performed to vary the setpoints of the secondary actuators 222 and 224 to thereby bring the temperatures of the control sensors 120a-120n to within desired temperature ranges. The desired temperature ranges, in this case, may generally represent acceptable levels of error in controlling the temperatures of the sensors 120a-120n. Thus, for instance, the desired temperature ranges may be larger if a higher level of error is acceptable.

At step 408, the controller 130 may receive signals from the control sensors 120a-120n of the primary actuator 114a-114n families. The signals are generally control signals for operating respective primary actuators 114a-114n. The signals are generated according to the levels of error between measured temperatures and predefined temperatures. More particularly, if the temperature difference is relatively small, the signal sent to the controller 130 is also relatively small. Alternatively, if the temperature difference is relatively large, the signal sent to the controller 130 is also relatively large. The controller 130, in this case, may comprise a proportional, integral, derivative (PID) controller, and may control operations of the primary actuators 114a-114n based upon the magnitudes of the control signals received from the control sensors 120a-120n as described in greater detail herein below with respect to step 412. In addition, each of the primary actuators 114a-114n may include respective PID controllers.

For each primary actuator 114a-114n family having a control sensor 120a-120n that transmits a control signal indicating an error, the controller 130 may implement the actuator control module 218 to select a control scheme to implement in manipulating the secondary actuators 222 and 224, as indicated at step 410. As described above with respect to the control system 202, one of the secondary actuators 222 may comprise a variable frequency drive (VFD) for controlling an airflow volume varying device, such as a blower or fan. The other secondary actuator 224 may comprise a device for controlling the temperature of the cooled air supplied by the primary actuators 114a-114n, and may depend upon the type of primary actuator 114a-114n in which the secondary actuator 224 is located.

Disclosed below are four control schemes that the controller 130 may implement in controlling the secondary actuators 222 and 224. It should, however, be understood that the controller 130 may implement other control schemes without departing from a scope of the method 400.

The first control scheme involves the direct linkage of one of the secondary actuators 222 (VFD's) to the supply air temperature (SAT) setpoints of the primary actuators 114a-114n throughout a range of control. The range of control may be defined as a predefined range of supply air temperatures and VFD settings within which the primary actuators 114a-114n may operate. In this regard, the range of control may be based upon levels that are known to provide adequate levels of cooling airflow at adequate temperatures. In any regard, the linkage between the VFD setpoints (secondary actuator 222) and the SAT setpoints (secondary actuator 224) may be described through the following equation:

$$VFD = VFD_{max} + \gamma(SAT_{min} - SAT).$$ Equation (1)

In Equation (1), $VFD_{max}$ is the maximum allowable VFD setpoint, $SAT_{min}$, is the minimum allowable supply air temperature, and $\gamma$ is $(VFD_{max} - VFD_{min})/(SAT_{max} - SAT_{min})$ $VFD_{min}$ is the minimum allowable VFD setpoint and $SAT_{max}$ is the maximum allowable supply air temperature.

Figure 5A:
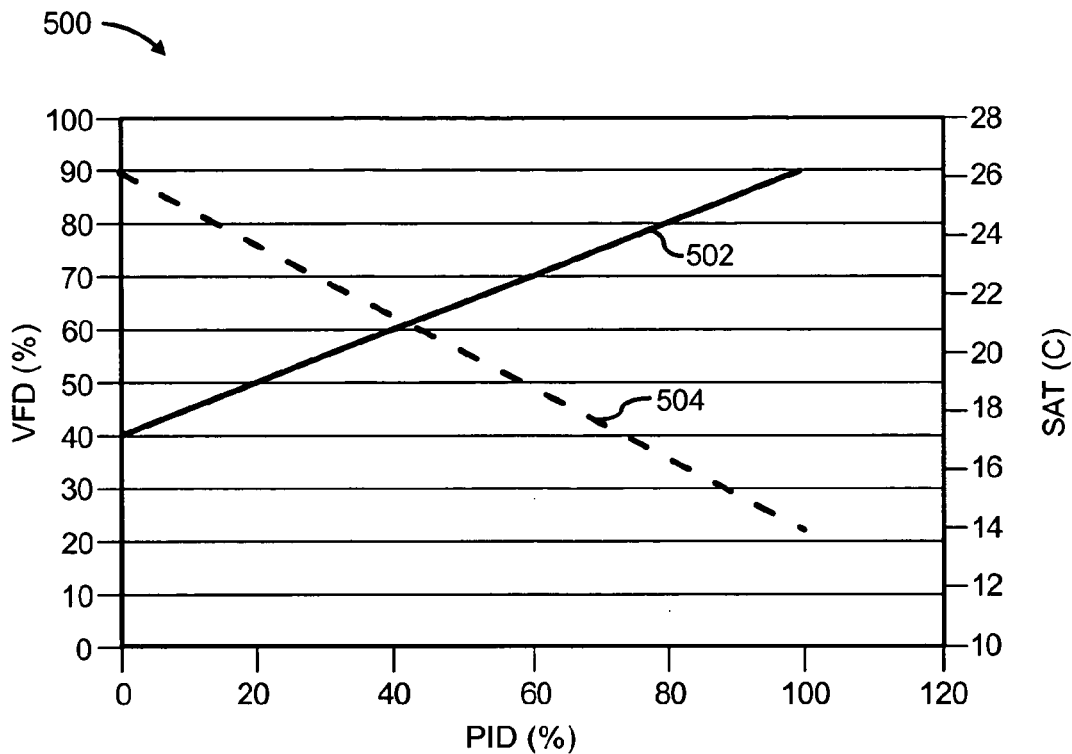
FIGS. 5A-5C show diagrams of respective control schemes that may be implemented in various methods disclosed herein, according to an embodiment of the invention.

A diagram 500 illustrating the first control scheme is depicted in FIG. 5A. As shown, the diagram 500 includes the VFD setpoints in terms of percentages along one vertical axis and the SAT setpoints in terms of degrees Celsius along another vertical axis. The diagram 500 also includes the output of a proportional, integral, derivative (PID) control system (controller 130) in terms of percentages along the horizontal axis. The outputs of the PID control system 130 may correspond to the magnitudes of the control signals received from the control sensors 120a-120n.

The solid line 502 represents the VFD setpoints and the dashed line 504 represents the SAT setpoints. The lowest point of the VFD setpoints (solid line 502) indicates the minimum allowable VFD setpoint ($VFD_{min}$) and the highest point of the VFD setpoints (solid line 502) indicates the maximum allowable VFD setpoint ($VFD_{max}$). The highest point of the SAT setpoints (dashed line 504) indicates the maximum allowable SAT setpoint ($SAT_{max}$) and the lowest point of the SAT setpoints (dashed line 504) indicates the minimum allowable SAT setpoint ($SAT_{min}$). The lines 502 and 504 representing the VFD setpoints and SAT setpoints, respectively, may vary depending upon the minimum and maximum allowable VFD and SAT setpoints, which may differ for different configurations of data centers 100. In this regard, the features shown in the diagram 500 are to be taken as being representative of the first control scheme and not as limiting the first control scheme to what is shown in FIG. 5A.

Figure 5B:
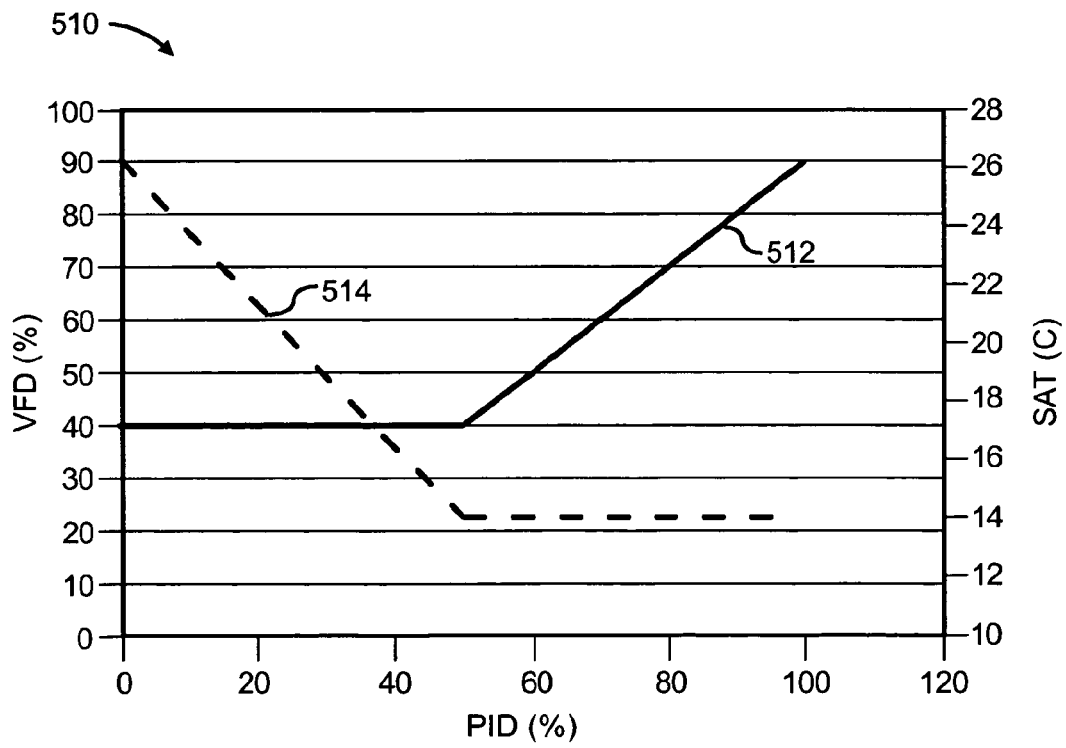

The second control scheme is described with respect to the diagram 510 depicted in FIG. 5B. The diagram 510 is similar to the diagram 500 depicted in FIG. 5A and thus contains similar elements, such as the various horizontal and vertical axes depicted therein. The differences, however, lie in the shapes and positions of the lines representing the VFD setpoints (solid line 512) and the SAT setpoints (dashed line 514). As shown in FIG. 5B, the second control scheme involves holding the VFD setpoint (solid line 512) at a constant minimum VFD setpoint ($VFD_{min}$) when the PID control system output ranges from 0% to N %, where N is a value between 20-80%. The value N is a function of the effect that each secondary actuator 222 and 224 has on the sensors 120a-120n. Since the PID control system output is linear, the value of N=50% is appropriate in most instances. However, if energy consumption is also considered, for instance, if a VFD is very expensive compared to temperature, N may exceed 50%, in FIG. 5B, which generally allows the actuator for controlling temperature to perform most of the work.

During this output range, the SAT setpoint (dashed line 514) decreases linearly from a maximum SAT setpoint ($SAT_{max}$) to a minimum SAT setpoint ($SAT_{min}$). At a PID control system 130 output above N % (50% in FIG. 5B), the SAT setpoint (dashed line 514) is held constant at the minimum SAT setpoint ($SAT_{min}$) and the VFD setpoint (solid line 512) increases linearly from the minimum VFD setpoint ($VFD_{min}$) to the maximum VFD setpoint ($VFD_{max}$).

The lines 512 and 514 representing the VFD setpoints and SAT setpoints, respectively, may vary depending upon the minimum and maximum allowable VFD and SAT setpoints, which may differ for different configurations of data centers 100. In this regard, the features shown in the diagram 510 are to be taken as being representative of the second control scheme and not as limiting the second control scheme to what is shown in FIG. 5B.

Figure 5C:
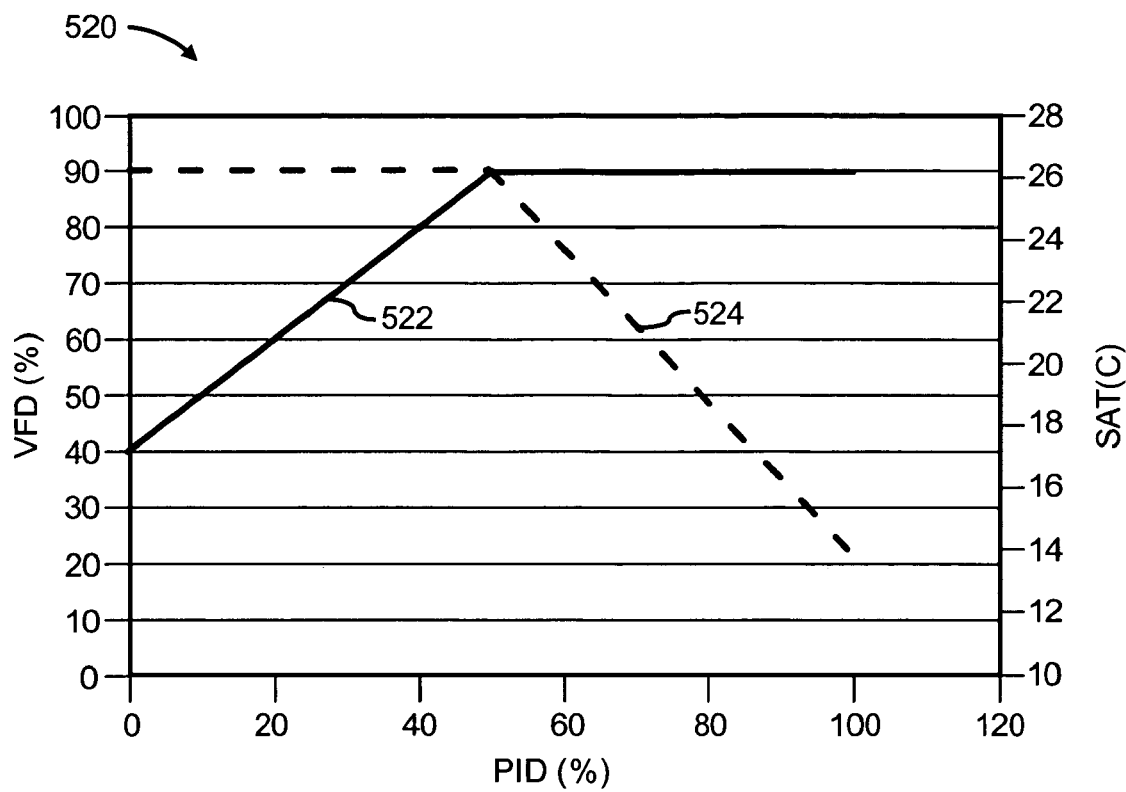

The third control scheme is described with respect to the diagram 520 depicted in FIG. 5C. Again, the diagram 520 is similar to the diagram 500 depicted in FIG. 5A and thus contains similar elements, such as the various horizontal and vertical axes depicted therein. In addition, the differences lie in the shapes and positions of the lines representing the VFD setpoints (solid line 522) and the SAT setpoints (dashed line 524). As shown in FIG. 5C, in this control scheme, the SAT setpoint (dashed line 524) is held constant at the maximum SAT setpoint ($SAT_{max}$) when the PID control system 130 output ranges from 0% to N %, where N is a value between 20-80%, as described above. During this output range, the VFD setpoint (solid line 522) is increased linearly from the minimum VFD setpoint ($VFD_{min}$) to the maximum VFD setpoint ($VFD_{max}$). At a PID control system 130 output above N % (50% in FIG. 5C), the VFD setpoint (solid line 522) is held constant at the maximum VFD setpoint ($VFD_{max}$) and the SAT setpoint (dashed line 544) decreases linearly until the SAT setpoint reaches the minimum SAT setpoint ($SAT_{min}$).

The lines 522 and 524 representing the VFD setpoints and SAT setpoints, respectively, may vary depending upon the minimum and maximum allowable VFD and SAT setpoints, which may differ for different configurations of data centers 100. In this regard, the features shown in the diagram 520 are to be taken as being representative of the third control scheme and not as limiting the third control scheme to what is shown in FIG. 5B.

The fourth control scheme involves determining a sliding window of VFD setpoints based upon changes to the SAT setpoints. The sliding window includes minimum and maximum limits for VFD setpoint variations. The minimum and maximum limits may be based upon the wall temperature limits in the coils and the capacities of the primary actuators 114a-114n. More particularly, for instance, the maximum and minimum VFD setpoints may be relatively limited based upon the SAT setpoints. These limitations may be necessary because if the airflow velocity flowing over heat exchanger coils in the primary actuators 114a-114n is too low for a particular SAT setpoint, heat transfer resistance between the coils and the airflow stream may rise beyond desired levels. This rise generally necessitates that the temperatures of the heat exchanger coils be reduced to provide the same level of cooling. However, a relatively large reduction in the coil temperature may lead to icing on the coils, which may substantially reduce the ability of the coils to transfer heat with the airflow stream.

On the other hand, higher airflow velocities for any given coil temperature generally improves heat transfer and provisioning of the primary actuators 114a-114n. This change in primary actuator 114a-114n loading may impact its coefficient of performance (COP) and its distribution of cooling load in the data center 100. Thus, for a given SAT setpoint, minimum and maximum VFD setpoint limits may be defined to generally ensure that the airflow stream flowing over the heat exchanger coils is sufficiently high to a prevent undesirable reduction in the exchange of heat between the airflow and the coolant contained in the coils, while also substantially preventing inefficient operation of the VFD. As such, windows of acceptable VFD setpoints may be defined for a number of SAT setpoints.

A sliding window of SAT setpoints may alternatively be determined for various VFD setpoints. In this regard, for a given VFD setpoint, a minimum and a maximum SAT setpoint may be defined according to the factors described above. In this regard, windows of acceptable SAT setpoints may be defined for a number of VFD setpoints.

At step 410, the controller 130 may select the control scheme that consumes the least amount of energy. The amount of energy consumed by the primary actuators 114a-114n in performing the control schemes described above may depend upon whether the primary actuators 114a-114n comprise chilled water type CRAC units or vapor-compression type CRAC units. In this regard, for each primary actuator 114a-114n whose associated control sensor is above the maximum temperature, the controller 130 may determine or predict the energy requirements for each of the control schemes. The energy requirements for each of the control schemes may be determined through testing and the results of the testing may be stored, for instance, in the data storage module 220. In addition, the energy requirements for the control schemes may be determined through a direct measurement of the primary actuator 114a-114n energy requirement levels at various PID control system 130 outputs. This information may be stored in the form of a look-up table in the data storage module 220. In addition, or alternatively, this information may be compared graphically as shown in FIGS. 6A and 6B.

Figure 6A:
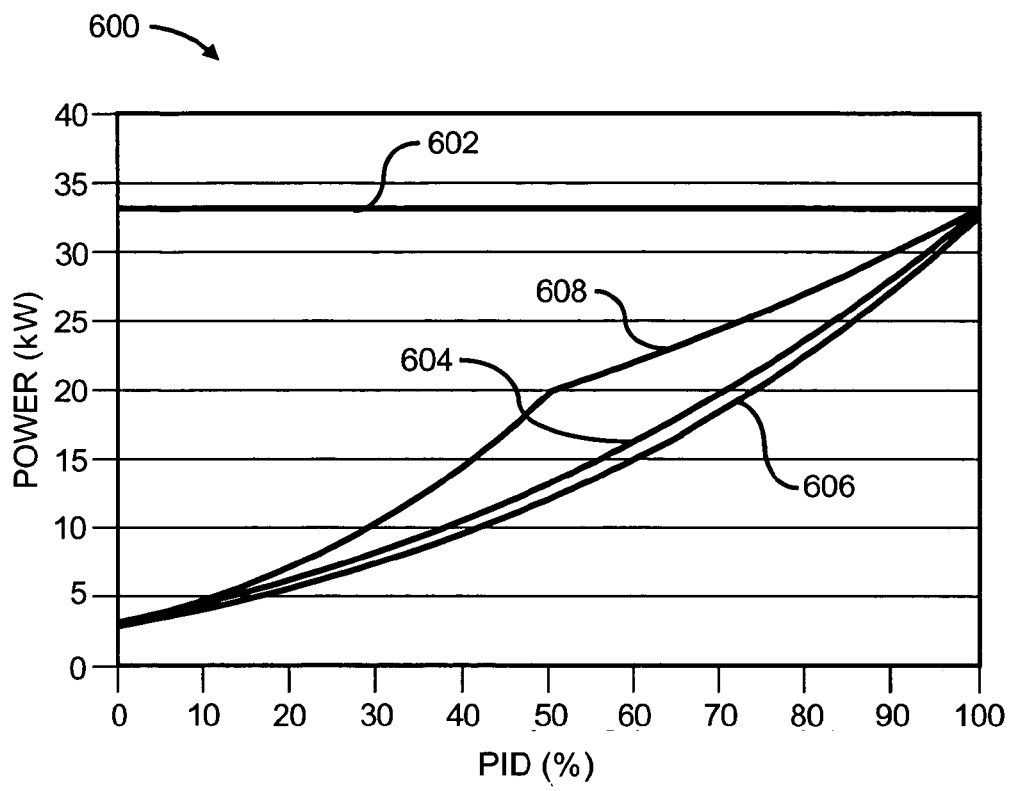
FIGS. 6A and 6B depict diagrams for respective energy consumption versus PID control system output levels for the various control schemes, according to an embodiment of the invention.
Figure 6B:
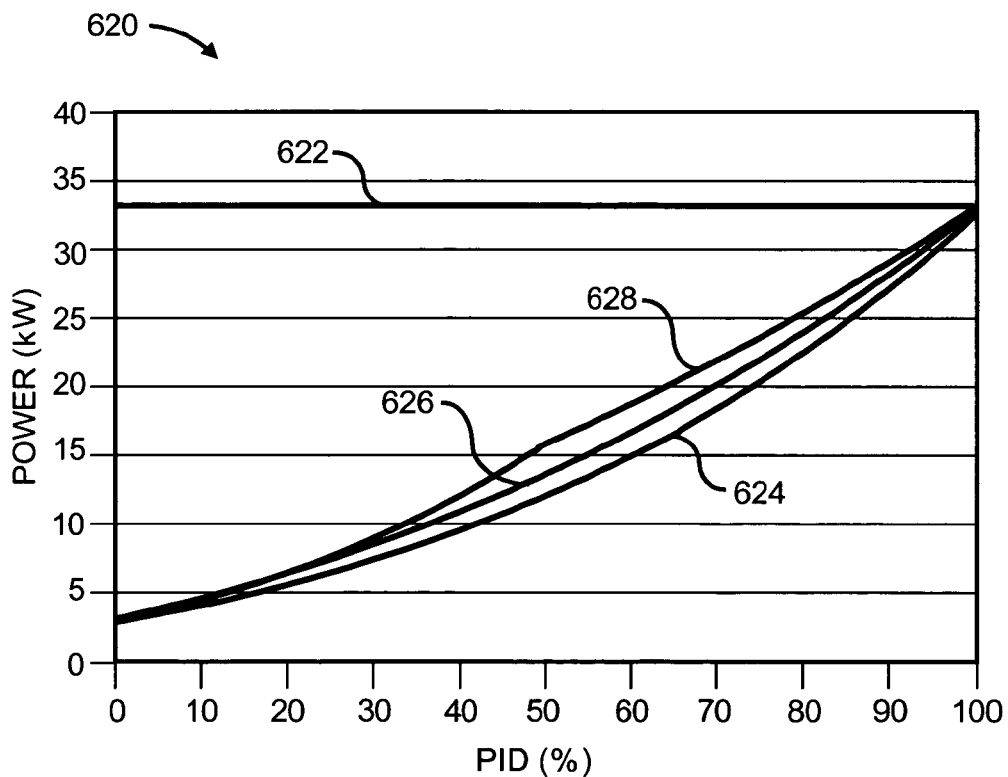

More particularly, FIGS. 6A and 6B depict diagrams 600 and 620, respectively, which illustrate two examples of energy consumption versus PID control system 130 output. It should be understood that the diagrams 600 and 620 represent examples of possible energy consumption comparisons and are thus not be taken as limiting the method 400 to what is shown in FIGS. 6A and 6B.

With reference first to FIG. 6A, the diagram 600 depicts an example of an energy consumption versus PID control system output for a chilled water type primary actuator 114a. The diagram 600 depicts the energy consumption level for a standard control scheme (line 602) over a range of PID control system 130 outputs. In addition, the diagram 600 includes the energy consumption levels for the first control scheme (line 604), the second control scheme (line 606), and the third control scheme (line 608). As shown in FIG. 6A, each of the control schemes (lines 604-608) requires less energy throughout the PID control system 130 output levels as compared to the standard control scheme (line 602), until the PID control system 130 output reaches 100%.

The diagram 600 indicates that the second control scheme (line 606) requires the least amount of energy throughout the PID control system 130 output levels. As such, according to the diagram 600, the controller 130 may select the second control scheme at step 410.

Referring now to FIG. 6B, the diagram 620 depicts an example of an energy consumption versus PID control system output for a vapor-compression type primary actuator 114a. The diagram 620 also depicts the energy consumption for a standard control scheme (line 622) over a range of PID control system 130 outputs. The diagram 620 further depicts the energy consumption levels for the first control scheme (line 624), the second control scheme (line 626), and the third control scheme (628). As also shown in FIG. 6B, each of the control schemes (lines 624-628) requires less energy throughout the PID control system 130 output levels as compared to the standard control scheme (line 622), until the PID control system 130 output reaches 100%.

The diagram 620 indicates that the first control scheme (line 624) requires the least amount of energy throughout the PID control system output levels. As such, according to the diagram 620, the controller 130 may select the first control scheme at step 410.

The controller 130 may store information pertaining to the energy requirements for the primary actuators 114a-114n in performing each of the control schemes. This information may be stored in the data storage module 220 and may be updated if the energy requirements vary for the primary actuators 114a-114n. In addition, the controller 130 may access the data storage module 220 to determine which of the control schemes to implement when it is determined that a primary actuator 114a-114n is to be manipulated. As such, the controller 130 may not be required to re-calculate the energy requirements each time step 410 is performed. In addition, the controller 130 may relatively quickly select to implement the control scheme requiring the least amount of energy utilization.

At step 412, the controller 130 may implement the actuator control module 218 to implement the control scheme selected at step 410. In implementing the selected control scheme, the controller 130 may cause the secondary actuators 222 and 224 to operate at the VFD and SAT setpoints for the selected control scheme. By way of example, if the controller 130 selected to implement the first control scheme at step 410 on a primary actuator 114a, the controller 130 may determine the current PID control system 130 output for that primary actuator 114a. The outputs of the PID control system 130 may correspond to the magnitudes of the control signals received from the control sensors 120a-120n. In addition, during a first iteration of step 412, the controller 130 may set the VFD and the SAT setpoints to the levels corresponding to the current PID control system 130 output for the first control scheme (for instance, as shown in FIG. 5A).

Following manipulation of the secondary actuators 222 and 224 at step 412, it may be determined as to whether the method 400 is to continue, as indicated at step 414. If a "no"

condition is reached at step 414, the method 400 may end as indicated at step 416. The method 400 may end, for instance, following a predetermined length of time, following a predetermined number of iterations, manually discontinued, etc. If a "yes" condition is reached at step 414, the method 400 may continue beginning at step 418. More particularly, the control sensors 120a-120n for each primary actuator 114a-114n family may be chosen again, as described above with respect to step 406. The control sensors 120a-120n may be selected again because they may have changed due to manipulations of the secondary actuators 222 and 224 at step 412.

At step 420, the controller 130 may receive control signals from the control sensors 120a-120n as described above with respect to step 408. In addition, step 418 may be repeated if a "no" condition is reached at step 420. In addition, the secondary actuators 222 and 224 may be manipulated at step 422 according to the control scheme selected at step 410. The manipulation of the secondary actuators 222 and 224 may be performed as described above with respect to step 412.

Following manipulation of the secondary actuators 222 and 224 at step 422, it may again be determined as to whether the operational mode 400 is to continue at step 414. Steps 418-422 may be repeated for a substantially indefinite period of time or when it is determined that the operational mode 400 is to be discontinued at step 414.

Although not shown, the step 404 of commissioning the sensors 120a-120n may be repeated, for instance, if new equipment is installed in the data center 100, if vent tiles 118 have been moved, if equipment has been moved or re-oriented, etc.

According to another example, some or all of the steps contained in the method 400 may be performed on a zonal basis. In this example, step 404 may additionally include the step of assigning the primary actuators 114a-114n into one or more zones. The zones may include two or more primary actuators 114a-114n, including all of the primary actuators 114a-114n in the data center 100. In addition, zones may comprise, for instance, primary actuators 114a-114n that are in relatively close proximity to each other. The zones may also comprise the sensors 120a-120n belonging to the primary actuators 114a-114n contained in the respective zones. The primary actuators 114a-114n may be assigned to the zones based upon, for instance, the degree of primary actuator 114a-114n family overlap during the commissioning process, the proximity of the primary actuators 114a-114n in a data center 100, the installation of plenum dividers that effectively limit the influence of various primary actuators 114a-114n, etc.

At step 406, instead of choosing a sensor 120a-120n in each primary actuator 114a-114n family, the controller 130 is configured to implement the control sensor selection module 216 to choose a control sensor 120a for each zone, according to, for instance, the criteria defined above for choosing a control sensor 120a. The control sensors 120a-120n for each zone are used to control the primary actuators 114a-114n contained in the respective zones as described in greater detail herein below.

At step 408, the controller 130 may receive control signals from the control sensors 120a-120n for each zone according to the levels of error between the measured temperatures and the predefined temperatures. For each zone having a control sensor 120a-120n that transmits a control signal indicating an error, the controller 130 may implement the actuator control module 218 to select a control scheme to implement in manipulating the secondary actuators 222 and 224, as indicated at step 410 and as described in greater detail hereinabove.

The controller 130 may also implement the actuator control module 218 to manipulate the secondary actuators 222 and 224 at step 412. More particularly, in this example, the controller 130 may cause the VFD setpoints for each of the primary actuators 114a-114n in each zone to be set to the same level. The level at which the VFD setpoints are set may be based upon the selected control scheme and the PID control system output for the primary actuator 114a of the primary actuator 114a family to which the control sensor belongs. The controller 130 may cause the SAT setpoint for the primary actuator 114a of the primary actuator 114a family to which the control sensor belongs to be set according to the selected control scheme. In addition, for the remaining primary actuators 114b-114n, the controller 130 may set their respective SAT setpoints according to the control schemes selected for those primary actuators 114b-114n.

In this regard, although the VFD setpoints for each of the primary actuators 114a-114n may be set on a zonal basis, the SAT setpoints may be individually set. In one respect, the VFD's 222 of the primary actuators 114a-114n for each of the zones may be operated in unison through implementation of this example, which generally reduces the number of changes in the primary actuator 114a-114n families and may thus provide a more predictable thermal response.

In addition, steps 414-422 may be performed in much the same way as described above, but on a zonal basis as also described above with respect to the primary actuators 114a-114n being assigned to respective zones.

The operations set forth in the methods 300 and 400 may be contained as a utility, program, or subprogram, in any desired computer accessible medium. In addition, the methods 300 and 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 7:
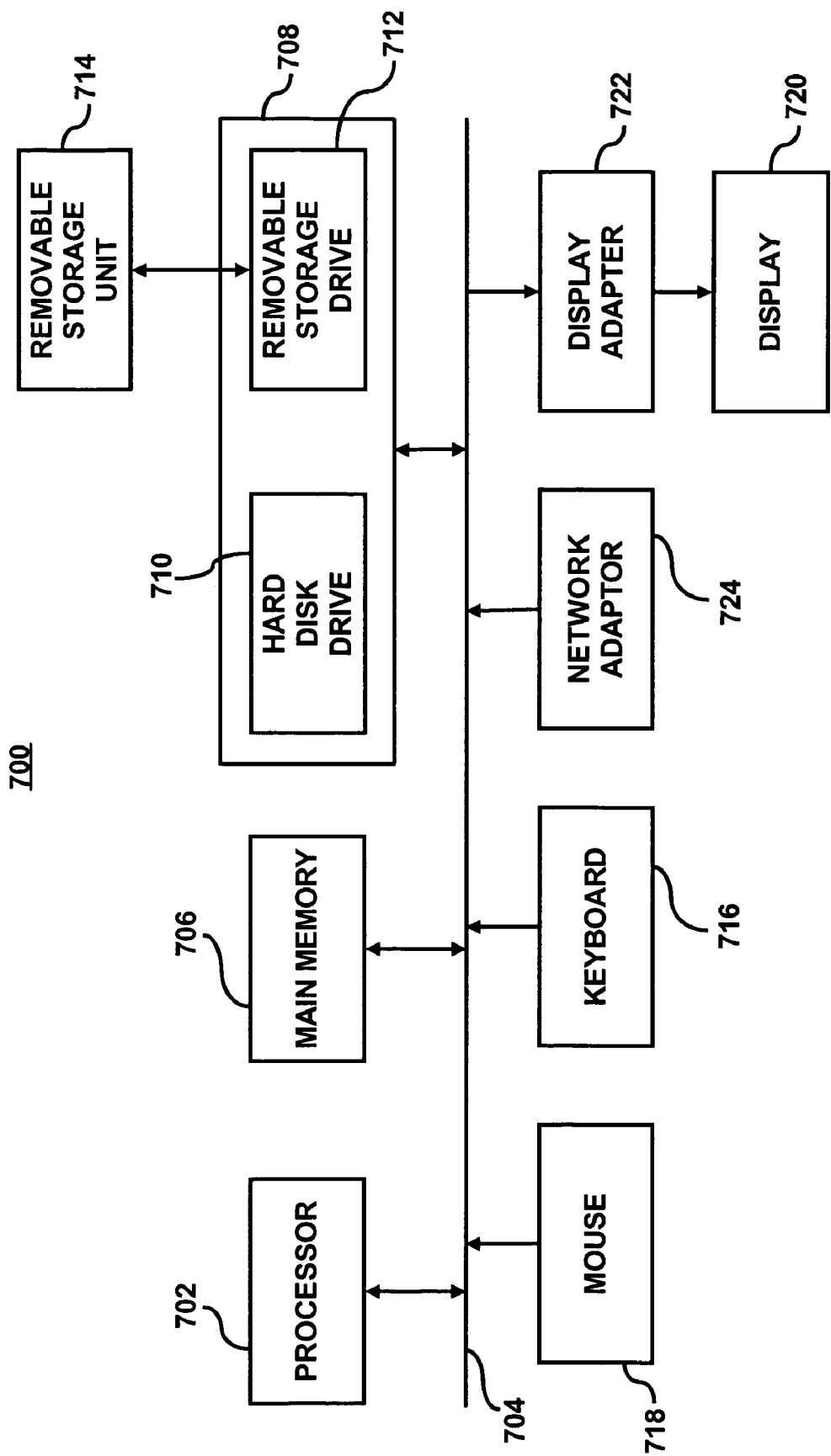
FIG. 7 illustrates a computer system, which may be employed to perform the various functions of the environmental control system, according to an embodiment of the invention.

FIG. 7 illustrates a computer system 700, which may be employed to perform the various functions of the controller 130 described hereinabove, according to an embodiment. In this respect, the computer system 700 may be used as a platform for executing one or more of the functions described hereinabove with respect to the controller 130.

The computer system 700 includes one or more controllers, such as a processor 702. The processor 702 may be used to execute some or all of the steps described in the methods 300 and 400. Commands and data from the processor 702 are communicated over a communication bus 704. The computer system 700 also includes a main memory 706, such as a random access memory (RAM), where the program code for, for instance, the controller 130, may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for the environmental control system may be stored.

The removable storage drive 710 reads from and/or writes to a removable storage unit 714 in a well-known manner. User input and output devices may include a keyboard 716, a mouse 718, and a display 720. A display adaptor 722 may interface with the communication bus 704 and the display 720 and may receive display data from the processor 702 and convert the display data into display commands for the display 720. In addition, the processor 702 may communicate over a network, for instance, the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for controlling temperature using a sensor network and a primary actuator, said method comprising:

commissioning the sensors of the sensor network, wherein commissioning the sensors comprises identifying a level of influence the primary actuator has on each of the sensors and assigning those one or more sensors over which the primary actuator has at least a predetermined level of influence to a family of the primary actuator;

determining energy utilization requirements of the primary actuator in performing each of a plurality of control schemes to maintain the sensors in the primary actuator family within a predefined temperature range;

selecting the one of the plurality of control schemes for operating the primary actuator that requires the least amount of energy to maintain the sensors in the primary actuator family within the predefined temperature range; and implementing the selected one of the plurality of control schemes.

2. The method according to claim 1, wherein the primary actuator comprises secondary actuators, said secondary actuators comprising a device for controlling supply airflow volume and a device for controlling supply airflow temperature, wherein the plurality of control schemes comprises various schemes for controlling the secondary actuators, and wherein implementing the selected one of the plurality of control schemes comprises implementing the selected one of the plurality of control schemes to control one or both of the secondary actuators.

3. The method according to claim 1, wherein the step of commissioning the plurality of sensors further comprises assigning the sensors to at least one primary actuator family, the method further comprising:

choosing a control sensor of the sensors, wherein the step of choosing a control sensor comprises choosing as the control sensor, the sensor having the highest positive temperature difference from a setpoint temperature, and if none of the sensors have a positive temperature difference, then choosing as the control sensor the sensor having the largest negative difference from the setpoint temperature.

4. The method according to claim 3, further comprising:

determining a level of difference between a measured temperature and a predefined temperature of the control sensor; and transmitting an error signal corresponding to the difference.

5. The method according to claim 4, wherein the step of choosing the control sensor further comprises choosing a control sensor in each primary actuator family, and wherein the step of determining a level of difference further comprises determining a level of difference between a measured temperature and a predefined temperature of the control sensors in each primary actuator family and wherein the step of transmitting an error signal further comprises transmitting an error signal corresponding to each of the determined difference levels.

6. The method according to claim 5, wherein the step of selecting one of the plurality of control schemes further comprises selecting one of the plurality of control schemes for each primary actuator family having a chosen control sensor that transmitted an error signal.

7. The method according to claim 6, wherein a primary actuator of the at least one primary actuator family comprises secondary actuators, said secondary actuators comprising a device for controlling supply airflow volume and a device for controlling supply airflow temperature, wherein the plurality of control schemes further comprises schemes for controlling the secondary actuators according to correlations between the supply airflow volume, the supply airflow temperature, and an output of a proportional, integral, derivative (PID) control system, and wherein the step of implementing the selected control scheme further comprises varying at least one of the supply airflow volume, the supply airflow temperature, and the PID control system output according to the correlation corresponding to the selected control scheme.

8. The method according to claim 7, wherein the step of implementing the selected control scheme further comprises manipulating the secondary actuators to have supply airflow volume and supply airflow temperature setpoints that correspond to a first PID control system output level for the selected control scheme.

9. The method according to claim 6, wherein the step of commissioning further comprises assigning a plurality of primary actuator families into at least one zone, and wherein the step of choosing the control sensor further comprises choosing the sensor having the highest positive temperature difference from a setpoint temperature for each zone, and if none of the sensors have a positive temperature difference, then choosing as the control sensor the sensor having the largest negative difference from the setpoint temperature for each zone.

10. The method according to claim 9, wherein the step of implementing the selected control scheme further comprises manipulating the secondary actuators of the primary actuators in each zone to have supply airflow volume setpoints that correspond to a PID control system output level for the control scheme selected for the primary actuator family to which the control sensor belongs and manipulating the secondary actuators of the primary actuators in each zone to have supply airflow temperature setpoints that correspond to respective PID control system output levels for the control schemes selected for each primary actuator family in each zone.

11. The method according to claim 6, wherein the plurality of control schemes further comprises:
   a first control scheme that includes a direct linkage between the supply airflow volume setpoint and the supply airflow temperature setpoint, such that the supply airflow volume setpoint increases substantially linearly and the supply airflow temperature decreases substantially linearly as the PID control system output increases;
   a second control scheme that includes holding the supply airflow volume setpoint at a substantially constant minimum level and decreasing the supply airflow temperature setpoint substantially linearly until the PID control system output reaches a predefined value, and following arrival at the predefined value, increasing the supply airflow volume setpoint substantially linearly and holding the supply airflow temperature setpoint at a substantially constant minimum temperature level as the PID control system output increases;
   a third control scheme that includes increasing the supply airflow volume substantially linearly from the minimum level and holding the supply airflow temperature at a substantially constant maximum temperature level until the PID control system output reaches the predefined value, and following arrival at the predefined value, holding the supply airflow volume setpoint at a substantially constant maximum level and decreasing the supply airflow temperature setpoint substantially linearly as the PID control system output increases; and
   a fourth control scheme that includes a sliding window of VFD setpoints based upon SAT setpoints, wherein the window of VFD setpoints comprises minimum VFD setpoints and maximum VFD setpoints that respectively correspond to the SAT setpoints.

12. A system for controlling environmental conditions at a plurality of sensor locations, said system comprising:
   a plurality of primary actuators configured to vary conditions detected by the sensors;
   a controller configured to implement at least one algorithm configured to:
      assign the sensors to one or more primary actuator families according to correlations between the sensors and the plurality of primary actuators, wherein the correlations are based upon an identification of a level of influence each of the plurality of primary actuators has over each of the sensors;
      choose a control sensor for each of the one or more primary actuator families;
      determine energy utilization requirements of the plurality of primary actuators in performing each of a plurality of control schemes to maintain the sensors in the one or more primary actuator families within a predefined temperature range;
      select the one of the plurality of control schemes to operate the plurality of primary actuators that requires the least amount of energy to maintain the sensors in the primary actuator families within the predefined temperature range; and
      implement the selected control scheme in response to the control sensor having a temperature above the predefined maximum temperature.

13. The system according to claim 12, wherein the control sensor comprises the sensor in a primary actuator family having the highest positive temperature difference from a setpoint temperature and if none of the sensors have a positive temperature difference, the sensor in a primary actuator family having the largest negative difference from the setpoint temperature.

14. The system according to claim 12, wherein each of the primary actuators comprises secondary actuators, said secondary actuators comprising:
   a device for controlling supply airflow volume; and
   a device for controlling supply airflow temperature, wherein the controller is configured to implement the selected control scheme by manipulating one or both of the supply airflow volume and the supply airflow temperature according to the selected control scheme.

15. The system according to claim 14, wherein the plurality of control schemes comprise schemes for manipulating the secondary actuators of each primary actuator according to correlations between the supply airflow volume, the supply airflow temperature, and an output of a proportional, integral, derivative (PID) control system.

16. The system according to claim 15, wherein the controller is further configured to implement algorithms for manipulating the secondary actuators to operate at a supply airflow volume setpoint and a supply airflow temperature setpoint that correspond to a first PID control system output level for the selected control scheme.

17. The system according to claim 15, wherein the controller is further configured to implement algorithms for assigning the primary actuators into at least one zone and for choosing as a control sensor for each zone, the sensor having the highest positive temperature difference from a setpoint temperature, and if none of the sensors have a positive temperature difference, the sensor having the largest negative difference from the setpoint temperature.

18. The system according to claim 17, wherein the controller is further configured to implement algorithms for manipulating the secondary actuators of the primary actuators in each zone to operate at a supply airflow volume setpoint that corresponds to a PID control system output level for the control scheme selected for the primary actuator family to which the control sensor belongs and for manipulating the secondary actuators of the primary actuators in each zone to have supply airflow temperature setpoints that correspond to respective PID control system output levels for the control schemes selected for each primary actuator family in each zone.

19. The system according to claim 15, wherein control schemes further comprise:
   a first control scheme that includes a direct linkage between the supply airflow volume setpoint and the supply airflow temperature setpoint, such that the supply airflow volume setpoint increases substantially linearly and the supply airflow temperature decreases substantially linearly as the PID control system output increases;
   a second control scheme that includes holding the supply airflow volume setpoint at a substantially constant minimum level and decreasing the supply airflow temperature setpoint substantially linearly until the PID control system output reaches a predefined value, and following arrival at the predefined value, increasing the supply airflow volume setpoint substantially linearly and holding the supply airflow temperature setpoint at a substantially constant minimum temperature level as the PID control system output increases;
   a third control scheme that includes increasing the supply airflow volume substantially linearly from the minimum level and holding the supply airflow temperature at a substantially constant maximum temperature level until the PID control system output reaches the predefined value, and following arrival at the predefined value, holding the supply airflow volume setpoint at a substantially constant maximum level and decreasing the supply airflow temperature setpoint substantially linearly as the PID control system output increases; and a fourth control scheme that includes a sliding window of VFD setpoints based upon SAT setpoints, wherein the window of VFD setpoints comprises minimum VFD setpoints and maximum VFD setpoints that respectively correspond to the SAT setpoints.

20. A system comprising:

means for sensing temperature at a plurality of locations;

means for actuating configured to vary conditions detected by the means for sensing;

means for commissioning the means for sensing by identifying a level of influence the means for actuating has on each of the means for sensing and assigning those one or more means for sensing over which the means for actuating has at least a predetermined level of influence to a family of the means for actuating;

means for determining energy utilization requirements of the means for actuating in performing each of a plurality of control schemes to maintain the means for sensing in the means for actuating family within a predefined temperature range;

means for selecting a control scheme from a plurality of control schemes to operate the means for actuating based upon energy utilization requirements of the plurality of control schemes; and means for manipulating the means for actuating according to the control scheme selected by the means for selecting.

21. A computer readable storage medium on which is embedded one or more computer programs, said one or more computer programs implementing a method for controlling temperature using a sensor network, said one or more computer programs comprising a set of instructions for:

assigning the sensors of the sensor network to at least one primary actuator family, wherein the sensors are assigned based upon an identification of a level of influence each of a plurality of primary actuators has over each of the sensors;

choosing a control sensor in the at least one primary actuator family;

determining energy utilization requirements of the primary actuator in performing each of a plurality of control schemes to maintain the sensors in the primary actuator family within a predefined temperature range;

selecting the one of the plurality of control schemes for operating a primary actuator configured to maintain the temperature of the control sensor below a predetermined maximum temperature that requires the least amount of energy.

* * * * *